(12) United States Patent
Daum et al.

(10) Patent No.: US 6,437,057 B1
(45) Date of Patent: Aug. 20, 2002

(54) NOVOLAK CYANATE BLENDS

(75) Inventors: Ulrich Daum, Hofstetten (CH); Alessandro Falchetto, Domodossola (IT)

(73) Assignee: Lonza AG (CH)

( * ) Notice: Subject to any disclaimer, the term of this patent is extended or adjusted under 35 U.S.C. 154(b) by 0 days.

(21) Appl. No.: 09/890,275

(22) PCT Filed: Feb. 7, 2000

(86) PCT No.: PCT/EP00/00944
§ 371 (c)(1),
(2), (4) Date: Aug. 10, 2001

(87) PCT Pub. No.: WO00/47676
PCT Pub. Date: Aug. 17, 2000

Related U.S. Application Data

(60) Provisional application No. 60/139,798, filed on Jun. 21, 1999.

(30) Foreign Application Priority Data

Feb. 10, 1999 (EP) .............................. 99102521

(51) Int. Cl.$^7$ ................................ C08G 8/28
(52) U.S. Cl. .................. 525/500; 525/501; 528/151; 528/162; 528/219; 528/492
(58) Field of Search ............... 525/390, 480, 525/494, 500, 501; 528/151, 162, 219, 492

(56) References Cited

U.S. PATENT DOCUMENTS

| | | | |
|---|---|---|---|
| 4,831,086 A | 5/1989 | Das et al. |
| 4,970,276 A | 11/1990 | Das et al. |
| 4,978,727 A | 12/1990 | Das et al. |
| 5,004,788 A | 4/1991 | Das et al. |
| 5,109,078 A | 4/1992 | Das et al. |
| 5,124,414 A | 6/1992 | Sajal et al. |
| 5,126,412 A | 6/1992 | Das et al. |
| 5,130,385 A | 7/1992 | Das |
| 5,426,161 A | 6/1995 | Das et al. |
| 5,741,879 A | 4/1998 | McCormick |
| 5,811,505 A | 9/1998 | McCormick |
| 5,955,543 A | 9/1999 | Sachdev et al. |

FOREIGN PATENT DOCUMENTS

JP 63090531 * 4/1988

* cited by examiner

Primary Examiner—Robert Dawson
Assistant Examiner—D. Aylward
(74) Attorney, Agent, or Firm—Fisher, Christen & Sabol

(57) ABSTRACT

Blends of novolaks and cyanates, such blends can be thermally hardened in a short time and without using a catalyst and have an excellent storage stability. The resins obtained by the blends can be used as binding agents in abradants or as chip coverings or printed circuit boards (PCB) in electronics.

6 Claims, No Drawings

NOVOLAK CYANATE BLENDS

This is a 371 of PCT/EPOO/00944, filed on Feb. 7, 2000, that has priority benefit of European Patent Application 99102521.4, filed on Feb. 10, 1999, and that has benefit of Provisional Application Ser. No. 60/139,798, filed on Jun. 21, 1999, that has priority benefit of European Patent Application 99102521.4, filed on Feb. 10, 1999.

The invention relates to blends of novolaks with cyanates and a process for their preparation.

In general, novolaks (phenol-formaldehyde polycondensation products) can be cured thermally, namely both with and without catalysts. In order to ensure the dimensional stability of the cured components, they must generally be subjected to a post-cure treatment. In order to avoid warping, the parts have to be clamped in suitable moulds which means an additional expenditure for manufacturing.

The object of the invention was to prepare novolak blends which instead of having this disadvantage possess such dimensional stability already after short thermal curing that a free-standing conditioning is made possible.

It has been possible to achieve this object of the invention with the blends of novolaks with cyanates of the invention.

The blends are composed of a novolak of the general formula

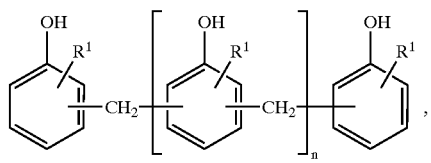

I wherein $R^1$ is hydrogen or methyl and n is a number greater than or equal to 1 and a cyanate of the general formula

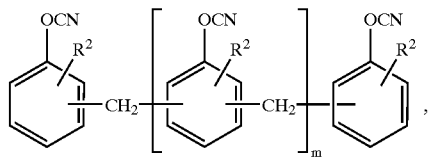

II wherein $R^2$ is methyl and m is a number greater than or equal to 1, and, optionally, one or more additional polymer(s), catalyst(s) and/or usual filler(s) or auxiliaries.

Novolaks of the general formula I, in particular those wherein $R^1$=H, are commonly known oligomeric condensation products of phenols with formaldehyde, which are obtainable industrially in various grades and with various properties. They can be polymerized with and without additives. Suitable novolaks with $R^1$=methyl ("cresol novolaks") are, for example, available under the designation 371B from the company Borden Chemicals.

Cyanates of the general formula II are generally prepared by reacting the corresponding oligomeric phenols with cyanogen chloride in the presence of a tertiary amine on the industrial scale and are likewise available in various grades and with various properties. They can be polymerized with and without additives, too.

The compounds customarily employed in the processing on novolaks may be used as catalysts. These are known to those skilled in the art. Flame retardants or additives for improving the thermal conductivity or the mechanical or electrical properties of the cured resin may be added as fillers and auxiliaries, for example. These additives are also known to those skilled in the art.

In the blend of the invention, the cyanate fraction of the combined amount of cyanate (II) and novolak (I) is judiciously from 10 to 90% by weight and the novolak fraction judiciously from 90 to 10% by weight, corresponding to a weight ratio cyanate:novolak of 10:90 to 90:10.

In the production of the blends of the invention, the procedure in general is to mix the components physically. Mixing can, for example, take place in a suitable mill, for example in a vibrating mill; alternatively, the components can be melted together or combined with the aid of an appropriate solvent, in which latter case it is necessary to remove the solvent again.

The blends of the invention are thermally curable within a short time and are additionally notable for high long-term stability in the uncured state, as can be shown, for example, by the constant gel time.

A further advantage of the blends according to the invention is that the gel time and hence the curing cycle for the blend is considerably shorter than for the individual components of the blend. As a result, the use of catalysts becomes either completely superfluous, or can at least be reduced considerably.

The invention additionally provides the resin obtainable by thermal curing of the blend according to the invention.

The mixture is advantageously cured without a catalyst by heating it at a temperature from 100 to 300° C., preferably from 150 to 250° C., for a period of 1 to 15 minutes.

The resultant cured blends are notable for outstanding dimensional stability and can therefore be employed, for example, in binders for abrasives or in the electronics sector for chip encapsulations or printed circuit boards (PCBs)

EXAMPLES

The following novolaks were employed:

Novolak A $R^1$=methyl

Novolak B $R^1$=H, low molecular weight

Novolak C $R^1$=H, high molecular weight

The novolaks listed above were mixed at the stated storage temperature T with the cyanate (II).

To measure the gel time, 5 g of a sample of the mixture which was freshly prepared or had been stored for the given period of time were placed on a plate measuring 10×10 cm and having a temperature of 200° C. and the time until the onset of gelling (gel time) was measured. The results of the measurements are summarized in Table 1 below. Fields without entries indicate that no measurement was carried out after the corresponding time.

TABLE 1

| Example No. | Mixing ratio [% by wt.] Novolak | Cyanate | Storage Temp. [° C.] | Gel time @ 200° C. [min] after storage for ... 0 Days | 1 Day | 2 Days | 3 Days | 5 Days | 6 Days | 14 Days |
|---|---|---|---|---|---|---|---|---|---|---|
| Compr. | 100 (A) | 0 | 20 | | 36 | | | | | 25 |
| Compr. | 0 | 100 | 20 | | 22 | | | | | 23 |
| 1 | 90 (A) | 10 | 20 | | 6 | | 6 | 6 | | 6 |
| 2 | 75 (A) | 25 | 20 | | 1.5 | 2.5 | | 2.2 | | 2.25 |
| 3 | 50 (A) | 50 | 20 | | 1 | 1.5 | | 1.0 | | 1.2 |
| 4 | 10 (A) | 90 | 20 | | 1.5 | 1.5 | | 1.2 | | 1.3 |
| 5 | 25 (A) | 75 | 20 | | 1.1 | 1.1 | | | 1.1 | |
| 6 | 50 (A) | 50 | 150 | 50" | 50" | | | | 55" | |
| 7 | 50 (B) | 50 | 20 | 37 | | | 35 | | | |
| 8 | 50 (B) | 50 | −15 | 37 | | | 35 | | | |
| 9 | 50 (C) | 50 | 20 | 20 | | | 20 | | | |
| 10 | 50 (C) | 50 | −15 | 20 | | | 20 | | | |

What is claimed is:

1. A blend of novolaks and cyanates, composed of a novolak of the formula:

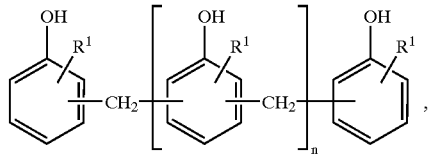

I wherein R¹ is hydrogen or methyl and n is a number $\geq 1$, and a cyanate of the formula:

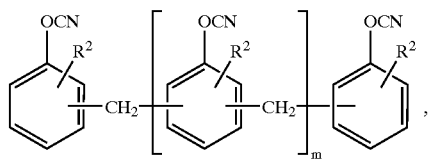

II wherein R² is methyl and m is a number $\geq 1$, and, optionally, at least one member from the group consisting of polymers, catalysts, fillers and auxiliaries.

2. The blend according to claim 1, wherein the weight ratio of cyanate (II) and novolak (I) is 10:90 to 90:10.

3. Resin prepared by thermal curing of a blend according to claim 1.

4. Process for preparing a resin, comprising curing a blend according to claim 1 at a temperature of 100 to 300° C.

5. Resin prepared by thermal curing of a blend according to claim 2.

6. Process for preparing a resin, comprising curing a blend according to claim 1 at a temperature of 100 to 300° C.

* * * * *